United States Patent [19]

Izawa et al.

[11] Patent Number: 5,179,561
[45] Date of Patent: Jan. 12, 1993

[54] TOTALLY SELF-CHECKING CHECKER

[75] Inventors: Nobuyoshi Izawa; Hiroki Arakawa, both of Tokyo, Japan

[73] Assignee: NTT Data Communications Systems Corporation, Tokyo, Japan

[21] Appl. No.: 782,720

[22] Filed: Oct. 28, 1991

Related U.S. Application Data

[63] Continuation of Ser. No. 392,879, Aug. 14, 1989, abandoned.

[30] Foreign Application Priority Data

Aug. 16, 1988 [JP] Japan .............................. 63-202698

[51] Int. Cl.$^5$ .............................................. H03M 13/02
[52] U.S. Cl. .............................................. 371/52; 371/3
[58] Field of Search ................................ 371/52, 3, 63

[56] References Cited

U.S. PATENT DOCUMENTS

| | | | |
|---|---|---|---|
| 3,533,066 | 3/1967 | Rees | 371/52 |
| 3,541,507 | 12/1967 | Duke | 371/63 |
| 3,559,167 | 7/1968 | Carter et al. | 371/3 |
| 3,559,168 | 7/1968 | Carter et al. | 371/3 |
| 3,602,886 | 8/1971 | Carter et al. | 371/63 |
| 3,784,977 | 1/1974 | Carter et al. | 371/63 |
| 3,825,894 | 7/1974 | Johnson, Jr. | 371/3 |
| 4,531,213 | 7/1985 | Scheuneman | 371/3 |
| 4,561,095 | 12/1985 | Khan | 371/40.1 |
| 4,891,809 | 1/1990 | Hazawa | 371/3 |
| 4,924,117 | 5/1990 | Tamaru | 371/63 |

FOREIGN PATENT DOCUMENTS

| | | | |
|---|---|---|---|
| 1937249 | 10/1977 | Fed. Rep. of Germany | 371/63 |
| 0615482 | 7/1978 | U.S.S.R. | 371/63 |

OTHER PUBLICATIONS

IEEE Transactions on Computers, vol. 37, No. 3, pp. 301-310, Mar. 1988, Antonis M. Paschalis et al, "Efficient Modular Design of TSC Checkers for M-out-of-2M Codes".
IEEE 1983, Takashi Nanya et al, "A 3-level Realization of Totally Self-Checking Checkers for M-out-of-N Codes".
A 3-Level Realization of Totally Self-Checking Checkers for m-out-of-n Codes, by Takashi Nanya and Yoshihiro Tohma.
Totally Self-Checking Checkers for Subsets of m-out-of-2m Codes, by Takashi Nanya and Toshihiko Hamamatsu.
Design of Self-Checking Checkers for Berger Code and m-out-of n Code, by Hideo Itoh and Matsuroh Nakamichi.
Reduced-Gate Design of Totally Self-Checking Checkers for Unordered Codes, by Nobuyoshi Izawa.
Efficient Design of Self-Checking Checker for any m-Out of-n Code, by Mohamed Abdelaziz Marouf and Arthur D. Friedman.
A Note on Self-Checking Checkers, by S. M. Reddy.
Design of Totally Self-Checking Check Circuits for m-Out-of-n Codes, by Douglas A. Anderson and Gernot Metze.

Primary Examiner—Robert W. Beausoliel
Assistant Examiner—Phung My Chung
Attorney, Agent, or Firm—Nikaido, Marmelstein, Murray & Oram

[57] ABSTRACT

A totally self-checking checker checks the faults of a logical circuit and also checks faults inside itself. The totally self-checking checker does not require a large number of gate circuits and minimizes the number of test code words that are used. The code words, of the code word sets to be used, are less than half of all the code words of code since the bits of code Y are divided into M disjoint partial sets.

2 Claims, 3 Drawing Sheets

TOTALLY SELF-CHECKING CHECKER

This application is a continuation of application Ser. No. 392,879 filed Aug. 14, 1989 now abandoned.

FIELD OF INVENTION

This invention relates generally to a totally self-checking checker. More the invention specifically relates to a checker that checks the faults of a logical circuit outputting M-out-of-2M code words by the checker in an electronic computer system, and relates to a totally self-checking checker in which the checker itself also checks the faults inside itself.

BACKGROUND OF THE INVENTION

As an electronic computer has recently become larger in scale and higher in performance, a quick response to faults is required. A lot of emphasis is put on a totally self-checking checker detecting the faults of a) logical circuit and b) checker during the execution of the system. As a result, a design method of the totally self-checking itself has been proposed with regard to the logical circuit outputting the M-out-of-2M code.

The M-out-of-2M code is a set of 2-value vectors having a logical value "1" of the M bits in 2M bits. The M-out-of-2M code has the largest number of code words in uni-directional error-detecting codes. It is recomended from the standpoint of checking speed that this totally self-checking checker, from input to output, be composed of a small number of logical gate levels. It is assumed at present that a 2-level logical gate design is a design having the least number of gate levels.

The totally self-checking checker in question is equipped with a one-level AND gate group inputting per code words of the code. The output of an AND gate group is input to an OR gate per the partial set with the code words divided into two code word sets. In the conventional totally self-checking checker mentioned above, the AND gates corresponding to all the code words and two OR gates inputting them are required. The total number of gates is {all the code words+2}.

It is required that all the code words is used to test this totally self-checking checker.

SUMMARY OF THE INVENTION

The totally self-checking checker of this invention has the feature that all the bits having the logical values 1,0 of the code word regarding the one part of the code word sets with code words divided into two parts, are systematically input into a one-level AND gate group and the one-level OR gate group, respectively. Each output of the AND and OR gate groups are also input in an OR gate and an AND gate, respectively.

The purpose of the invention is to provide a totally self-checking checker that does not require a large number of gate circuits and minimizes the number of test code words to improve conventional shortcomings. The code words of the code word set to be used are less than the half of all the code words of code.

DESCRIPTION OF THE DRAWINGS

FIG. 4 presents example of code word sets to be used for the totally self-checking checker by this invention.

DETAILED DESCRIPTION OF THE INVENTION

Figure 1:
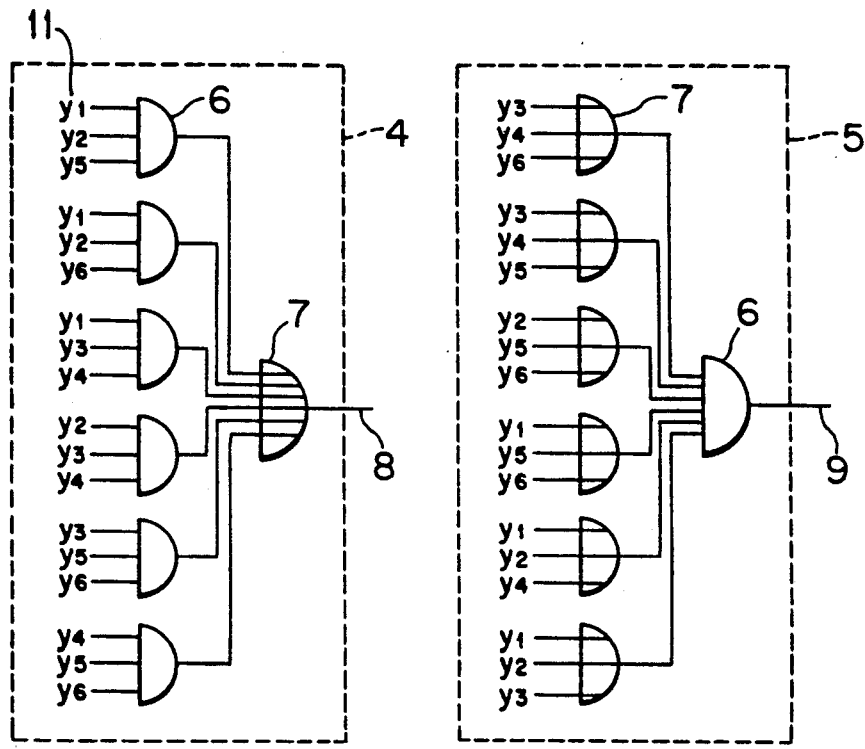
FIG. 1 shows the configuration of the totally self-checking checker for the 3-out-of-6 code output logical circuit indicating the embodiment of the present Invention.

FIG. 1 shows the outlined block diagram of the totally self-checking checker for the 3-out-of-6 code output logical describing one embodiment of this invention; where 4 and 5 are partial circuit, 6 is AND gate, 7 is OR gate, 8 and 9 are the output of each partial circuit and 11 is the logical variable yn of the 3-out-of-6 code.

Figure 2:
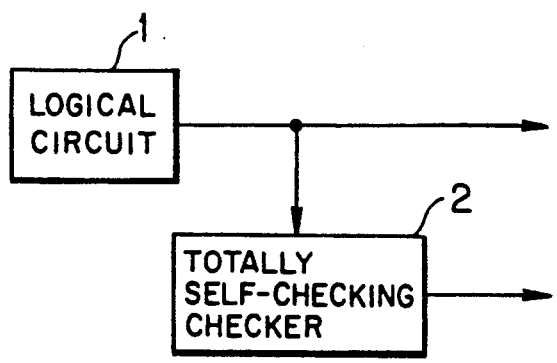
FIG. 2 is the schematic block diagram showing the M-out-of-2M code output logical circuit and the totally self-checking checker.

FIG. 2 is the outlined block diagram showing the logical circuit and the totally self-checking checker outputting the M-out-of-2M code discussed in this invention. Therein, 1 shows the logical circuit outputting the M-out-of-2M code and 2 shows the totally self-checking checker that detects the errors of the code output and checks its own defaults.

Figure 3:
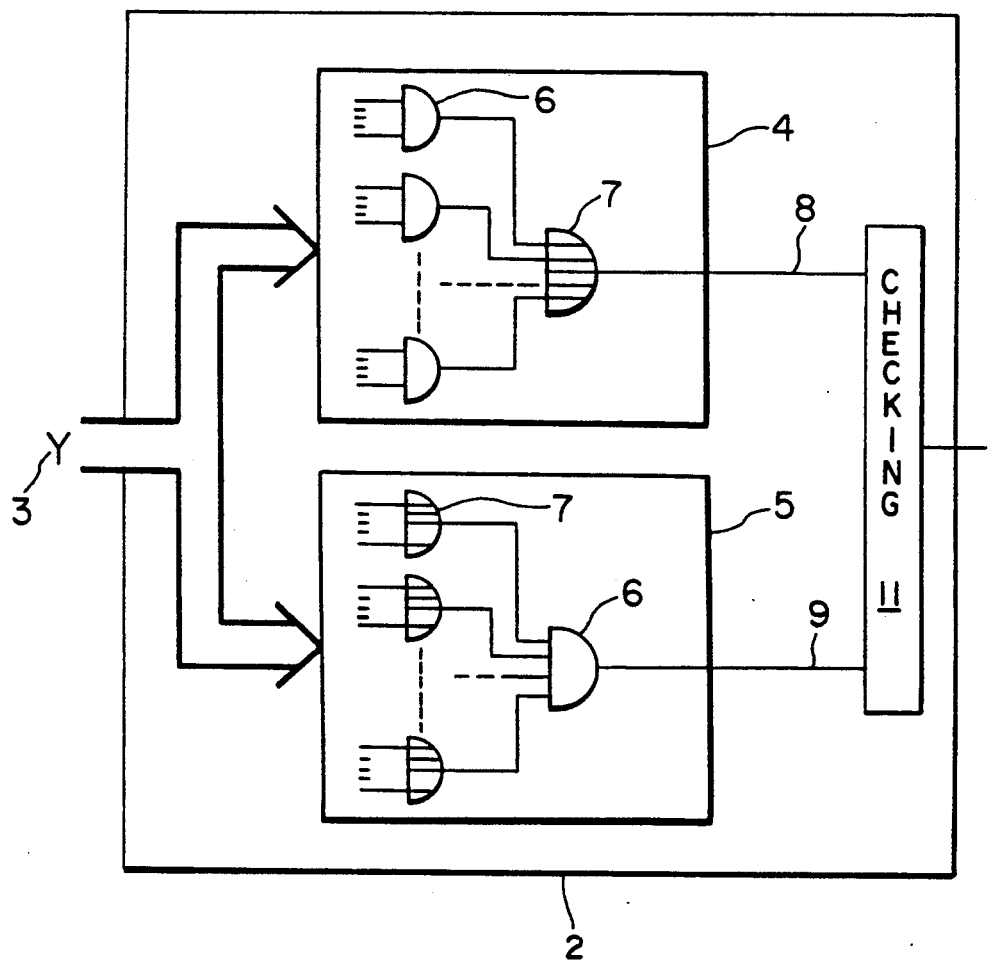
FIG. 3 is the schematic block diagram of the totally self-checking checker.

FIG. 3 is the block diagram showing the totally self-checking checker under this invention. In this figure, with the M-out-of-2M code as Y, and Y is divided into two code word sets $Y^0$ $Y^1$: ($Y^0$ $Y^1$=Y, $Y^0$ $Y^1$=Φ, $Y^0 \neq \Phi$, $Y^1 \neq \Phi$ where Φ represents an empty or null set).

In FIG. 3, 3 shows the M-out-of-2M code which is input as in the totally self-checking checker 2 and which is to be detected; 4 and 5 show the partial circuit inputting the bits having the respective logical value 1,0 belonging to $Y^0$; 6 indicates AND gate; 7 indicates OR gate; 8 and 9 show the output lines for individual partial circuit 4 and 5, namely the detected results. The detected results are usually output from two output lines 8 and 9 as shown in FIG. 3.

If the line outputting detected results is only one line of a, the output value when no fault is found in the checker will be a=0 and when any fault is found in the checker the output value will be a=1. In case any fault that the output value of a is fixed at "0" is brought about by a itself, the output value of a always becomes "0".

The result is that although a fault is found, the state of the output that faults are not taking place constantly is shown. Thus it is impossible to detect faults. This is not good.

While if the output line is two lines of a and b, the output value from a means 11 when any fault is not found in the checker, will be a=0, b=1 or a=1 and b=0 and when there is a fault found in the checker will be a=0, b=0 or a=1, b=1. If the fault that the output value of a is fixed at "0" is brought about by a itself, the output value of a always becomes "0". However, unless the fault that the output value of b is fixed at "1" is brought about by b itself, the output of b will become "0" without fail during the system's run. As a result, a=0, b=0, namely, this shows the output value that the checker is having faults; the fault of a can be checked. Since the two lines will have faults at the same time but the possibility is often rare, it becomes possible to detect the fault of the checker in an ordinary run.

A method of the code Y divided into two code word sets $Y^0$ and $Y^1$ is explained, since it is very important in this invention concerning the totally self-checked checker.

The Y bits(logical variable) $y_1, y_2, \ldots, y_n$ are divided into the M disjoint partial sets of $A_1, A_2, \ldots, A_m$, that have two elements each. Let the number of the logical value 1 of individual disjoint partial sets of $A_1, A_2, \ldots, A_m$ be $W_1, W_2, \ldots, W_M$.

However, $W_1 + W_2 + \ldots + W_M = M$, with the code word sets are produced; they are expressed as $Y(W_1|W_2|\ldots|W_M)$.

For example, in 3-out-of-6 code, it is divided as $A_1 = \{y_1, y_2\}$, $A_2 = \{y_3, y_4\}$, $A_3 = \{y_5, y_6\}$. The code word set, Y (2|0|1), consists of (1, 1, 0, 0, 1, 0) and (1, 1, 0, 0, 0, 1).

Furthermore, the code word sets are integrated by each value of $W_m$ and integrated code word sets are called large set of the code words. As shown below, integrated code words sets are expressed as Y [ ]. $W_m$ is 1 respectively, that is, the code word set Y (1|1|•••|1) becomes an independently large set of code words and is expressed as Y [1]. The code word sets other than Y [1], namely, $W_m = 2$ are integrated in the following large set of code words. The code word set of Y that the d objects of $W_m$ is 2 and that all remaining $W_m$ is either 0 or 1 is integrated into large set of code words Y [$2^d$].

The d objects of the remaining $W_m$ is 0. The reason is that since the sum of $W_m$ is M, if 2 is d objects, 0 also becomes objects; the remaining $W_m$ all becomes 1. As an integration example, the code word set where Y (2|0|1|•••|1) is integrated into Y [$2^1$].

Also, the $W_m$ expressed as $W_{M+1}, W_{M+2}, \ldots, W_{2M}$ to consider $W_m$ cyclically is equal to $W_1, W_2, \ldots, W_M$, respectively.

The two-division of code Y will divide Y [ ] into two and follows the following procedure.

DIVIDING PROCEDURE

If the following large set of code words exists in the M-out-of-2M code Y, it is divided as follows;

(1) empty $Y^0$, $Y^1$
(2) add Y [1] as $Y^1$ [1] to $Y^1$
(3) add the code word set with $W_m = 2$, $W_{m+1} = 0$ of Y [$2^1$] as $Y^0$ [$2^1$] to $Y^0$
(4) add the code word set of Y [$2^1$] other than the above (3) as $Y^1$ [$2^1$] to $Y^1$
(5) when Y [$2^d$]
   1) when d is even
      (a) add the code word set where $W_m = 2$, $W_{m+1} = 1$, $W_{m+2} = 0$ and that with $W_m = 2$, $W_{m+1} = 0$, $W_t = 2$, $W_{t+1} = 0$ when d=2 as $Y^1$ [$2^d$] to $Y^1$
      (b) add the code word set where Y [$2^d$] (d is even) other than the above (a) as $Y^0$ [$2^d$] to $Y^0$.
   2) when d is odd
      (a) add the code word set where $W_m = 2$, $W_{m+1} = 1$, $W_{m+2} = 0$ as $Y^0$ [$2^d$] to $Y^0$.
      (b) add the code word set where Y [$2^d$] (d is odd) other than the above $Y^1$ [$2^d$] to $Y^1$. However, m=1, 2, •••, M, $2 \leq d \leq |M/2|$ (|M/2| is the maximum integer less than M/2), t=m+2, m+3, •••, m+M−2.

In the above dividing procedure, $W_m$ other than the specified $W_m$ is assumed to take a combination of all allowable values. The combination of all allowable values means all the combinations that can be taken in the case other than the specified $W_m$ in the code word set. For example, since, in the $Y^0$ [$2^d$] in the above mentioned step (5)2) (a), 2 is d objects on the whole, 0 is also d objects and all remaining $W_m$ is 1.

Therefore, in the $W_m$ other than the specified $W_m$, 2 is d−1 objects, 0 is d−1 objects, all remaining $W_m$ become 1. Thus this case is to take this combination on every occasion. Thereafter, $W_m$ other than the specified $W_m$ shall take all allowable combinations.

The above dividing procedure covers all the code words and Y is disjointly divided to $Y^0$, $Y^1$. The code word sets in step (5)1) (b), 2) (b) consist of the code word set where $W_m = 2$, $W_{m+1} = 0$ (however, when d=2, $W_t = 2$, $W_{t+1} = 0$ are not included), the code word set where $W_m = 2$, $W_{m+1} = 1$, $W_{m+2} = 1$, and the code word set where $W_m = 2$, $W_{m+1} = 1$, $W_{m+2} = 2$. $W_t$ consisting of $W_t = 2$, $W_{t+1} = 1$, $W_{t+2} = 0$ does not exist in those code word sets. It is due to the fact that the code word sets containing such $W_t$ belong to step (5)1) (a) or 2) (a).

Figure 4:
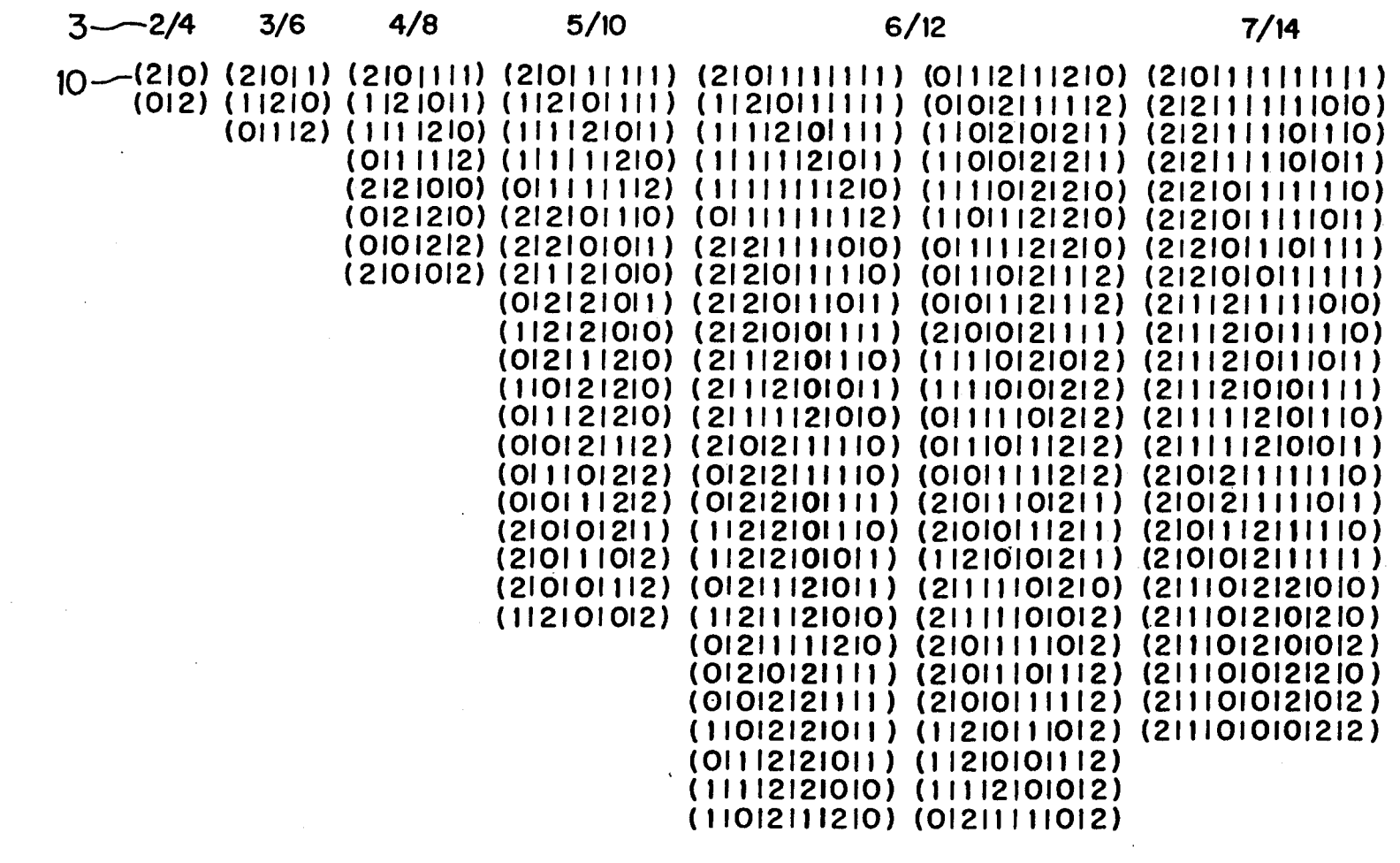

FIG. 4 shows the code word sets of $Y^0$ in the M-out-of-2M code Y of $2 \leq M \leq 7$. In FIG. 4, the M-out-of-2M code Y is expressed as M/2M; 10 is a code word set and Y of Y ( ) is omitted. Further, in M=7, code word set exist so great in number that the code word sets alone when m=1 are shown. In the code word sets of $Y^0$ [$2^2$], the same code word sets as those obtained when m=1 if m is incremented are omitted.

The code words of $Y^0$ in the 3-out-of-6 code consist of (1, 1, 0, 0, 1, 0), (1, 1, 0, 0, 0, 1) of Y(2|0|1), of (1, 0, 1, 1, 0, 0), (0, 1, 1, 1, 0, 0) of Y (1|2|0), and of (0, 0, 1, 0, 1, 1), (0, 0, 0, 1, 1, 1) of Y (0|1|2).

The totally self-checking checker in this invention is compared below with the conventional one in terms of the number of gates and that of tests (the number of code words required for tests).

As stated before, the conventional totally self-checking checker requires AND gates corresponding to all the code words and two OR gates. Therefore, the number of gates is {the number of all the code words+2}. All the code words are required for tests.

On the other hand, the number of gates in this invention is {2×(the total number of cord words of $Y^0$)+2}). The number of code words of $Y^0$ [$2^d$] with $d \geq 1$ and the number of code words of $Y^1$ [$2^d$] are almost equal. The code words of $Y^1$ [1] are all included in $Y^1$ as $Y^1$ [1].

Therefore, the total number of code words is less than half of the total number of code words of Y and the number of gates is smaller than that of the conventional totally self-checking checker. Tests can be conducted by all the code words of $Y^0$ (detecting 0 stuck-at faults of the input lines in the AND gate of the partial circuit 4 in FIG. 3 and 1 stuck-at faults of the input lines in the OR gate of the partial circuit 5 in FIG. 3) and by the code words of one of the $Y^1$ (detecting 1 stuck-at faults of the input lines in the AND gate of the partial circuit 4 in FIG. 3 and 0 stuck-at faults of the input lines in the OR gate of the partial circuit 5 in FIG. 3).

Except when M=2, the code word sets with $Y^1$ [1] of $Y^1$ do not require tests. Therefore, all the code words are not required for tests. Thus, unlike the tests required for the conventional totally self-checking checker, the number of tests is greatly disminished.

What is claimed is:

1. A method of checking a totally self-checking checker to check faults of code words produced from a logical circuit and to check faults inside the totally self-checking checker comprising the steps of:

providing a first circuit including a) a plurality of first AND gates, a number of which is less than half of a number of all M-out-of-2M code words receiving M bits input data from said logical circuit and b) a first OR gate receiving outputs from said first AND gates;

providing a second circuit including a) a plurality of second OR gates, a number of which is less than half of the number of all the M-out-of-2M code words, said second OR gates receiving remaining M bits input data from said logical circuit and b) a second AND gate receiving outputs from said second OR gates;

checking operation conditions of said logical circuit by receiving an output of said first OR gate and an output from second AND gate, wherein said checking operation conditions includes the steps of dividing M-out-of-2M coded data Y, where Y is a logical variable having 2M bits $Y_1, Y_2, \ldots Y_n$, into M disjoint partial sets $A_m = \{Y_m, Y_{m+1}\}$, where m=1 to M, each partial set having two elements, counting a number of logical value "1" existing in each set $A_m$ and producing data $W_m$, where m=1 to M, $\Sigma W_m = M$, integrating code words having a same value in each corresponding $W_m$, and producing code word sets which are represented by $Y(W_1 | W_2 | \ldots | W_m)$, storing integrated code words sets $Y(W_1 | W_2 | \ldots | W_m)$ and corresponding code words belonging to each of said code word sets, integrating code word sets by each value of $W_m$, 1 or 2, producing a large set of code words which are represented as Y[], where all of $W_m = 1$ in Y is represented as Y[1] and where code word sets having at least one of $W_m = 2$ are integrated to said large set of code words $Y[2^d]$ where d is a number of $W_m$ having value 2 existing in Y, and storing said large set of the code words Y[] and corresponding code words which result from the integration, disjointly dividing the large set of code words Y[] into two-divisions of code $Y^0$ and $Y^1$ based on predetermined conditions according to value and number of $W_m$ in the large set of code words Y[], selecting code words from stored data belonging to code $Y^0$, connecting M bits having, a same logical value in each code word, to the M bits input to said first AND gate, and connecting remaining M bits data, having complementaly logical values of code words, to the M inputs of said second OR gates; and selecting outputs of code words produced from said logical circuit and connecting to inputs of said first AND gates and said second OR gates, wherein when an output of said first OR gate is not equal to an output of said second AND gate, no fault is detected, and when an output of said first OR gate is equal to an output of said second AND gate, fault is detected.

2. A totally self-checking checker according to claim 1, said step of selecting code words from stored data belonging to code $Y^0$ comprises the steps of:

selecting the code word sets $Y[2^d]$ having d=2 ($1 \leq d$) for data $W_m$ and remaining data $W_m$ having values 0 or 1, wherein 1) selecting the code word sets $Y^0[2^d]$ having d=1, $W_m = 2$, $W_{m+1} = 0$, in the code word set $Y[2^d]$, 2) selecting even code word sets $Y^0[2^d]$ from $Y[2^d]$ for d is an even number, and excluding the code word sets $Y[2^d]$ where $W_m = 2$, $W_{m+1} = 1$, $W_{m+2} = 0$, and when d=2, excluding the code word sets $Y[2^d]$ where $W_m = 2$, $W_{m+1} = 0$, $W_t = 2$, $W_{t+1} = 0$ t=m+2, m+3, ... m+M−2, 3) selecting odd code word sets $Y^0[2^d]$ from $Y[2^d]$ when d($3 \leq d$) is odd number, having $W_m = 2$, $W_{m+1} = 1$, $W_{m+2} = 0$, connecting M bits data having the same logical value in each of the code words in said even code word sets of $Y^0[2^d]$, and odd code word set of $Y^0[2^d]$, to the M bits input of said first AND gates; and connecting the remaining M bits data, having complementaly logical values in each of the code words in said even code word sets of $Y^0[2^d]$, and odd code word set of $Y^0[2^d]$, to the M bits input of said second OR gates.

* * * * *